(12) United States Patent
Gioulekas et al.

(10) Patent No.: US 8,769,389 B2
(45) Date of Patent: Jul. 1, 2014

(54) TECHNIQUES FOR RATE MATCHING AND DE-RATE MATCHING

(75) Inventors: Fotios Gioulekas, Palamas (GR); Angelos Spanos, Kings Langley (GB); Michael Birbas, Patras (GR)

(73) Assignee: Analogies SA, Patras Innovation Hub, Kastritsi, Patras (GR)

( * ) Notice: Subject to any disclaimer, the term of this patent is extended or adjusted under 35 U.S.C. 154(b) by 39 days.

(21) Appl. No.: 13/475,940

(22) Filed: May 18, 2012

(65) Prior Publication Data

US 2012/0297276 A1 Nov. 22, 2012

Related U.S. Application Data

(60) Provisional application No. 61/487,383, filed on May 18, 2011.

(51) Int. Cl.
  *H03M 13/03* (2006.01)
  *G11C 29/00* (2006.01)
  *H03M 13/00* (2006.01)
  *H04L 1/00* (2006.01)

(52) U.S. Cl.
  CPC ........... *H03M 13/635* (2013.01); *H04L 1/0067* (2013.01); *H04L 1/004* (2013.01)
  USPC ............................ 714/790; 714/800; 714/769

(58) Field of Classification Search
  CPC .......... H03M 13/2957; H03M 13/635; H03M 13/6356; H03M 13/6362; H03M 13/1515; H03M 13/27; H03M 13/2792; H04L 1/0067; H04L 1/0068; H04L 1/0059; H04L 1/00
  USPC ................. 714/701–702, 790, 800, 805, 769, 714/770–771, 799; 370/252; 375/285
  See application file for complete search history.

(56) References Cited

U.S. PATENT DOCUMENTS

| 8,171,383 | B2 * | 5/2012 | Landau et al. | 714/790 |
| 8,509,168 | B2 * | 8/2013 | Kim et al. | 370/329 |
| 2011/0007834 | A1 * | 1/2011 | Hoshino et al. | 375/285 |

* cited by examiner

*Primary Examiner* — Christine Tu
(74) *Attorney, Agent, or Firm* — DP IP Group; Franco S. De Liguori

(57) ABSTRACT

Techniques are described to store and retrieve an encoded info bit stream, and appropriate first and second sets of parity bits to perform interleaving and rate matching, prior to transmission. On the receiver side, a recovery technique is provided which operates on the same principle as that of encoding, but decoding occurs in reverse. In accordance with an exemplary embodiment, three dedicated logical memories are provided for each of the encoded info bit stream and two sets of parity bits, respectively. The proposed solution provides an alternative methodology and/or hardware implementation for performing LTE compliant rate matching and de-rate matching when required to interleave info bits and parity bits.

4 Claims, 9 Drawing Sheets

$C^{TC}_{subblock} \leftarrow 32$
$R^{TC}_{subblock} \leftarrow \min R^{TC}_{subblock} : D \leq (C^{TC}_{subblock} \times R^{TC}_{subblock})$
{Interleavingprocess} for ( row = 0 ; row = row + 1 ; row < $R^{TC}_{subblock}$ )
do
   for (column = 0; column = column + 1; column < $C^{TC}_{subblock}$) do
     $TABLE_{2_0}(row, column) = d_0(row * C^{TC}_{subblock} + column)$
     $TABLE_{2_1}(row, column) = d_1(row * C^{TC}_{subblock} + column)$
   end for
end for for (row = 0; row = row + 1; row < $R^{TC}_{subblock}$) do
   for (column = 0; column = column + 1; column < $C^{TC}_{subblock}$) do
     $TABLE_{2_0}(row, column) \leftarrow TABLE_{2_0}(P(row), column)$
     $TABLE_{2_1}(row, column) \leftarrow TABLE_{2_1}(P(row), column)$
   end for
end for
$d_0$_counter $\leftarrow 0$
for (row = 0; row = row + 1; row < $R^{TC}_{subblock}$) do
   for (column = 0; column = column + 1; column < $C^{TC}_{subblock}$) do
     if $d_0$_counter $< K + 4$ then
       $v^{(0)}_{(row*C^{TC}_{subblock})+column} \leftarrow TABLE_{2_0}(row, column)$
       $v^{(1)}_{(row*C^{TC}_{subblock})+column} \leftarrow TABLE_{2_1}(row, column)$
       $d_0$_counter $= d_0$_counter $+ 1$
     end if
   end for
end for
for ($k = 0; k = k + 1; k < K + 4$) do
   interleavingAddress $\leftarrow P(\lfloor \frac{k}{R^{TC}_{subblock}} \rfloor + C^{TC}_{subblock} + 1) \bmod K_\pi$
   $v^{(2)}_k \leftarrow d_2(interleavingAddress)$
end for
for ($k = 0; k = k + 1; k < K + 4$) do
   $w_k \leftarrow v^{(0)}_k$;
end for
for ($k = 0; k = k + 1; k < K + 4$) do
   if ( k odd ) then
     $w_{(K+4+k)} \leftarrow v^{(1)}_k$
   else
     $w_{(K+4+k)} \leftarrow v^{(2)}_k$
   end if
end for
{Puncturingprocess}
for ($k = 1; k = k + 1; k \leq codeRate^{(-1)} * (K + 4)$) do
   $c_k \leftarrow w_k$
end for

FIG. 2

$$C_{subblock}^{TC} \leftarrow 32$$
$$R_{subblock}^{TC} \leftarrow \min R_{subblock}^{TC} : D \leq (C_{subblock}^{TC} \times R_{subblock}^{TC})$$

for $(k = 0; k = k + 1; k = K + 3)$ do
   $infoBuffer_k \leftarrow infoBit_k$
   $parityBuffer0_k \leftarrow parityBit0_k$
   $parityBuffer1_k \leftarrow parityBit1_k$
end for $infoBuffer_{k+4} \leftarrow interleavedBit_{k+1}$
$parityBuffer0_{k+4} \leftarrow interleavedBit_{k+2}$
$parityBuffer1_{k+4} \leftarrow interleavedBit_{k+3}$ $transmissionBufferLength \leftarrow codeRate^{(-1)} * K$ while $(r * (k + 4) < transmissionBufferLength)$ do
   for $(r = 1; r < 3; r++)$ do
     for $(k = 0; k < K + 4; k++)$ do
       if $(r * k < K + 4)$ then
         $interleav.Address \leftarrow \pi 1(k)$
         $e_k \leftarrow infoBuffer_{interleavedAddress}$
       else if $(k \in evenNumbers)$ then
         $interleav.Address \leftarrow \pi 1(k/2)$
         $e_k \leftarrow parityBuffer0_{interleavedAddress}$
       else
         $interleav.Address \leftarrow \pi 2((k-1)/2)$
         $e_k \leftarrow parityBuffer1_{interleavedAddress}$
       end if
     end for
   end for
end while

FIG. 3

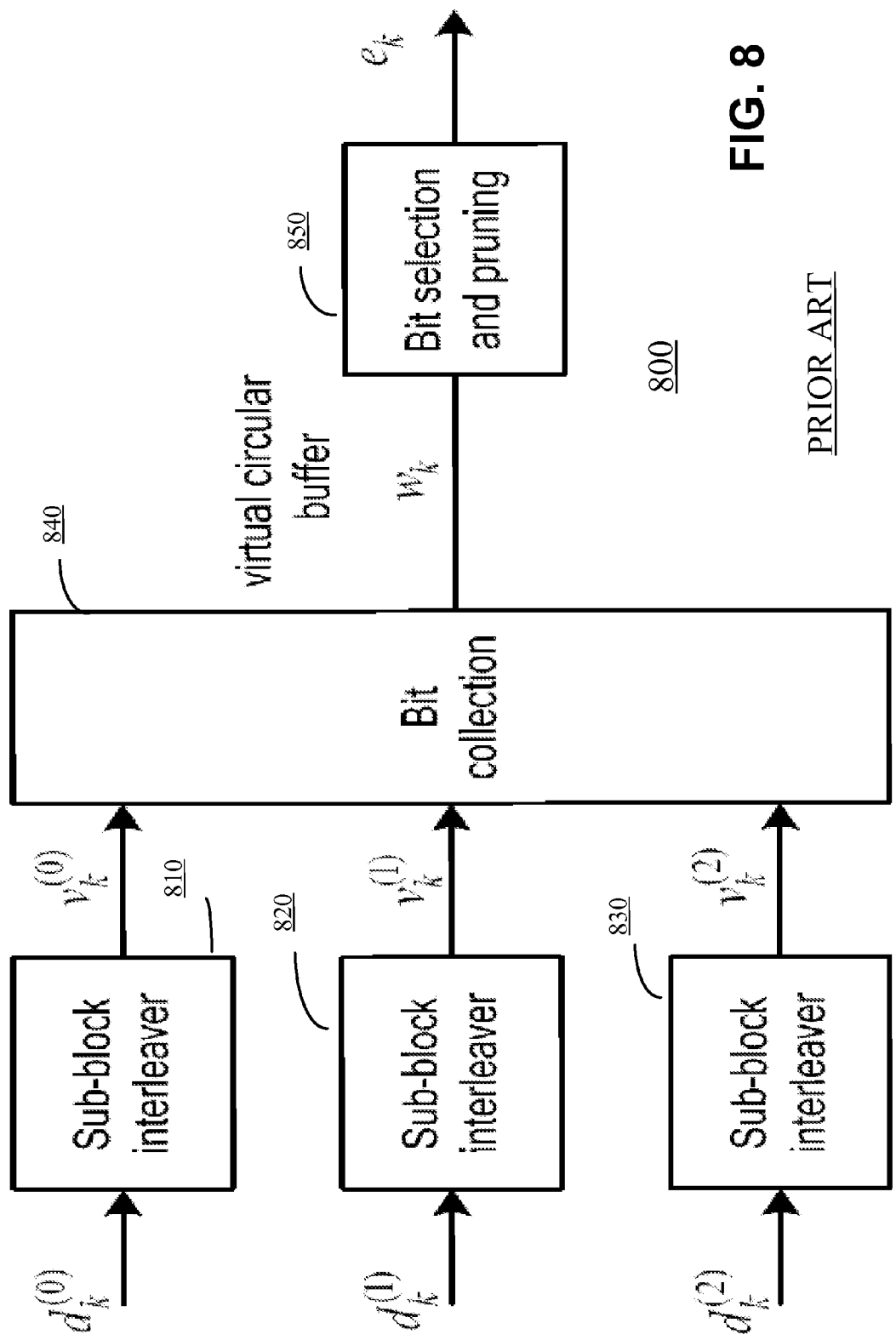

TECHNIQUES FOR RATE MATCHING AND DE-RATE MATCHING

RELATED APPLICATIONS

This application claims the benefit of U.S. Provisional Application No. 61/487,383, filed on May 18, 2011, commonly owned and assigned to the same assignee hereof.

TECHNICAL FIELD

This application claims The present disclosure relates to communication systems and in particular to techniques for rate matching and de-rate matching within a communication system.

BACKGROUND

A transmitter of a mobile communication system performs channel encoding, rate matching, and interleaving processes on information bits. Similarly, a receiver of a mobile communication system performs de-rate matching, deinterleaving, and channel decoding processes.

The rate matching process is performed to match the number of encoded bits with a maximum traffic of a channel by performing repetition or pruning according to a rate matching pattern prior to transmission of the number of encoded bits over a channel. The interleaving process rearranges the order of an encoded bit stream in order to recover an original bit stream, even if some bits of the bit stream are lost by instantaneous noise.

The de-rate matching process releases the rate-matched state of the received data prior to decoding of the received data repeated or pruned at the receiver of the mobile communication system. Similarly, the deinterleaving process rearranges the interleaved bit stream in the original order.

Limitations and disadvantages of conventional and traditional approaches will become apparent to one of skill in the art, through comparison of such systems with some aspects of the present invention as set forth in the remainder of the present application with reference to the drawings.

SUMMARY

The present disclosure describes a technique to store and retrieve an encoded info bit stream, and appropriate first and second sets of parity bits to perform interleaving and rate matching, prior to transmission. On the receiver side, a recovery technique is provided which operates on the same principle as that of encoding, but decoding occurs in reverse.

In accordance with an exemplary embodiment, three dedicated logical memories are provided for each of the encoded info bit stream and two sets of parity bits, respectively.

The proposed solution provides an alternative methodology and/or hardware implementation for performing LTE compliant rate matching and de-rate matching when required to interleave info bits and parity bits.

In accordance with an exemplary embodiment, interleaving is controlled by an address assigner that controls memory addressing operations and thus defines the interleaving of bits to be transmitted. The proposed approach results in improved latency since bits are transmitted directly out of memory. Also, because permutation of bits is optimally determined by the address assigner, there is a memory block size benefit as well.

BRIEF DESCRIPTION OF THE DRAWINGS

FIG. 2 shows an LTE rate matching algorithm as shown and described in a specific version of standard.

FIG. 3 shows an algorithm for performing LTE compliant rate matching in accordance with an exemplary embodiment.

FIG. 8 is an LTE rate matching high level block diagram as shown and described in a specific version of standard.

DETAILED DESCRIPTION

Figure 1:
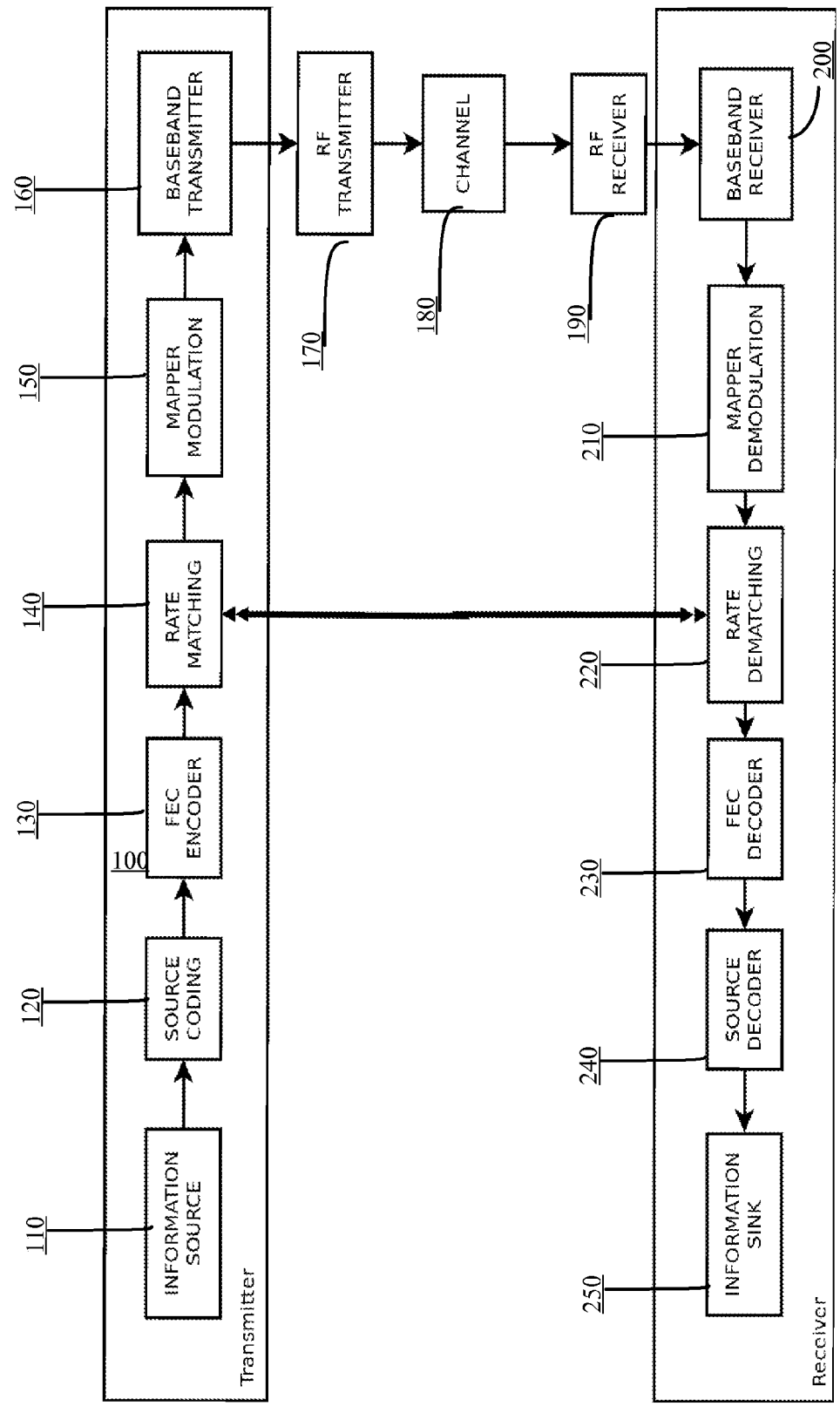
FIG. 1 depicts a block diagram of a mobile communication system.

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure is directed to a rate matching method and circuit in compliance with specific version of LTE standards, together with corresponding method and circuit for de-rate matching. LTE requires that LTE compliant wireless communication devices include both rate matching and de-rate matching. A current version of LTE standard in fact describes a specific configuration for compliance. Unfortunately, this configuration has certain limitations in terms of latency and resource (memory) usage.

The present disclosure describes a technique to store and retrieve an encoded info bit stream, and appropriate first and second sets of parity bits to perform interleaving and rate matching, prior to transmission. On the receiver side, a recovery technique is provided which operates on the same principle as that of encoding, but decoding occurs in reverse.

In accordance with an exemplary embodiment, three dedicated logical memories are provided for each of the encoded info bit stream and two sets of parity bits, respectively.

The proposed solution provides an alternative methodology and/or hardware implementation for performing LTE compliant rate matching and de-rate matching when required to interleave info bits and parity bits.

In accordance with an exemplary embodiment, interleaving is controlled by an address assigner that controls memory addressing operations and thus defines the interleaving of bits to be transmitted. The proposed approach results in improved latency since bits are transmitted directly out of memory. Also, because permutation of bits is optimally determined by the address assigner, there is a memory block size benefit as well.

FIG. 1 depicts a block diagram of an exemplary mobile communication system 100. Mobile communication system 100 includes an information source 110 that generates the information bits to be transmitted over a wireless medium. The information bits are fed into source coding block 120 which generates symbols that are received and processed by FE|C encoder 130 and rate matching block 140. The output thereof is sent to mapper modulation block 150 and from there to baseband transmitter block 160 whereby the digital data stream is forwarded to an RF transmitter block 170—typically a different chip or die.

The RF transmitter receives the digital data stream, converts to an analog RF signal, and transmits the package over a wireless communication channel 180. At the other end of communication channel 180, an RF receiver block 190 receives the transmitted RF signal and down converts it to a digital baseband frequency so a baseband receiver typically comprised with baseband receiver 200, mapper demodulation block 210, rate de-matching block 220, FEC decoder block 230, source decoder 240 and information sink 250, digitizes and then further processes the encoded bit stream to arrive at the original information bits before being fed into source coding block 120 for processing. Along the way, de-rate matching, deinterleaving, and channel decoding occurs.

The task of the rate matching is to extract from the code bits delivered by the channel encoder (turbo encoder) the exact set of bits to be transmitted within a given transmission time interval.

FIG. 8 is an LTE rate matching high level block diagram 800 as shown and described in a specific version of standard.

As illustrated in FIG. 8, the outputs of turbo encoder systematic bits $d_0$, parity1 bits $d_1$, and parity2 bits $d_2$ are separately interleaved by sub-block interleaving (facilitated by sub-block interleavers 810-830), to generate interleaved bit strings $v_0$, $v_1$ and $v_2$ respectively. The interleaved bit strings form a single bit string w, which is ultimately stored into what can be described as a circular buffer (bit collection block 840) with the systematic bits inserted first, followed by alternating the insertion of parity1 and parity2 bits. The bit selection then extracts consecutive bits from the circular buffer to an extent that fits the assigned resource. It transmits only a portion of this bit-string whose size is equal to $$\text{transmittedbitstringlength} = \text{codeRate}^{-1}*(K+4)$$

where K is the length of the information bits (info bits).

The set of bits to extract depends on the redundancy version (RV) corresponding to different starting points for the extraction of coded bits from the circular buffer.

FIG. 2 shows an LTE rate matching algorithm as shown and described in a specific version of standard.

The algorithm of FIG. 2 is an algorithm in accordance with the 3GPP LTE specification 3GPP TS 36.212 V8.3.0, Section 5.1.4, pp 15-20, which is incorporated herein by reference.

Based on this algorithm, a direct implementation of the approach would lead to the creation of eight (8) memory banks each sized as follows:
1. TABLE10 with size of K+4
2. TABLE11 with size K+4
3. TABLE20 with size K+4
4. TABLE21 with size K+4
5. $v_0$ with size K+4
6. $v_1$ with size K+4
7. $v_2$ with size K+4
8. w with size 3*K+12

The total memory size needed to support the rate matching process is 10*K+40. The tables mentioned herein can be found at the LTE standard.

The latency is defined by the following transfers of data.
1. From the RSC encoders to TABLE10,1
2. From the TABLE10,1 to the TABLE20,1
3. From the TABLE20,1 to the v(0,1)
4. From the v(0,1) to the w and finally
5. From the w to the serially transmitted bits $e_k$ FIG. 3 shows an algorithm for performing LTE compliant rate matching in accordance with an exemplary embodiment.

The proposed algorithm requires the storage of encoded information bits in a first memory block, while the separate first and second sets of parity bits are stored in a second and third memory blocks, respectively. In accordance with the illustrated embodiment, the first memory block has a size of K+4 bits while the second and third memory blocks combined have a size of 2*K+8 bits. As far as required memory to perform compliant rate matching, the current approach requires a total memory size that is 3*K+12 less than the memory required by the corresponding algorithm implementation shown and referred to in FIG. 2.

In the currently proposed approach, stored bits are transmitted immediately as the address selector defines the sequence of the bits to be transmitted in accordance to the sequence required by the standard.

The fact that bits are transmitted directly out of first memory block, second memory block and the third memory block, ultimately reduces the number of bit mapping and other permutations typically required down to only two steps. These two steps include transmissions:
1. from RSC encoders to the first memory (info RAM) and the second memory (parity1 RAM) and third memory (parity2 RAM); and
2. from the memory block to the multiplexer output As a result the latency of the system is significantly reduced when compared with the typical implementation of FIG. 2.

Figure 4:
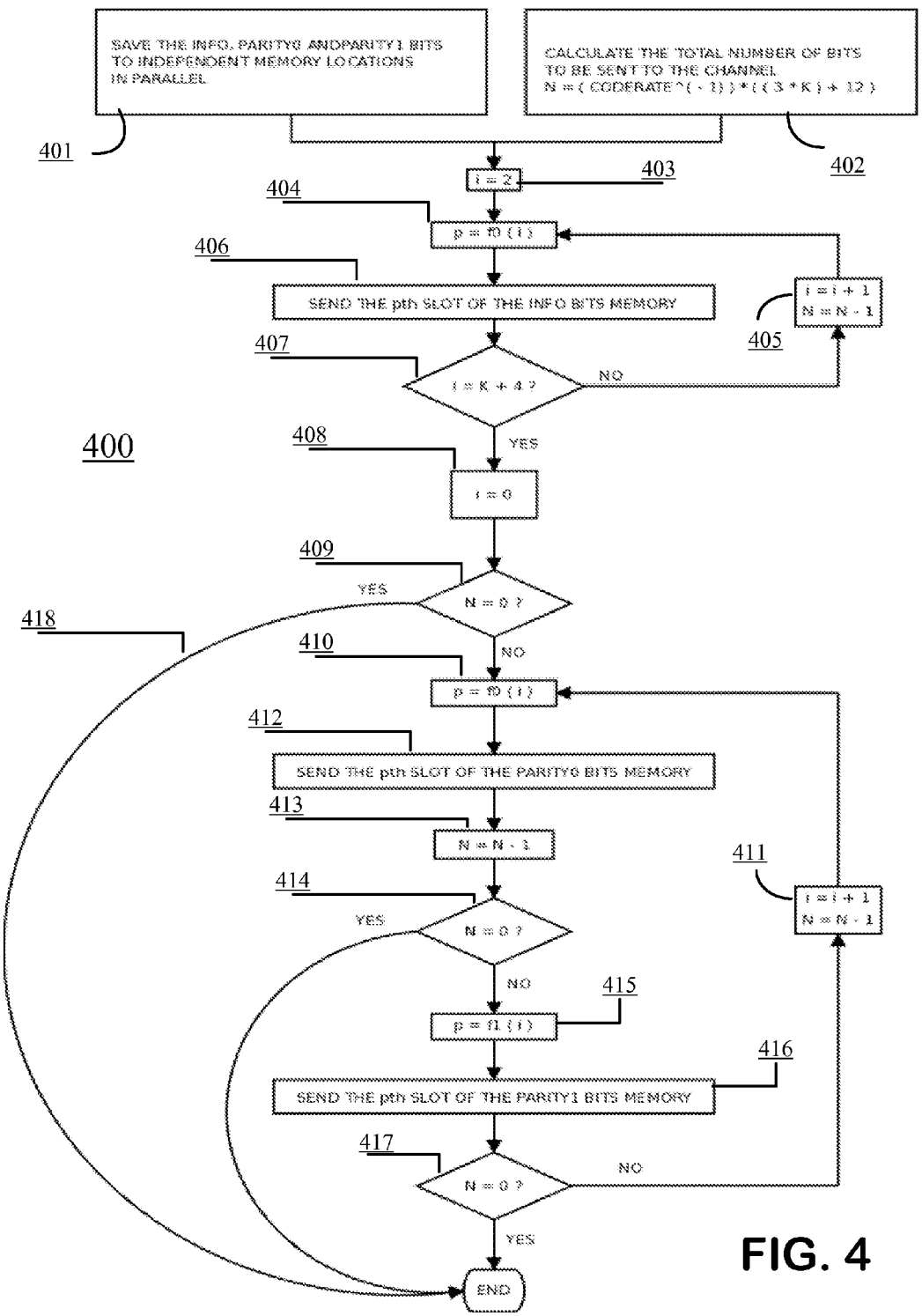
FIG. 4 shows an exemplary operational flow diagram of the algorithm shown in FIG. 3.

FIG. 4 shows an exemplary operational flow diagram 400 of the algorithm shown in FIG. 3.

Figure 5:
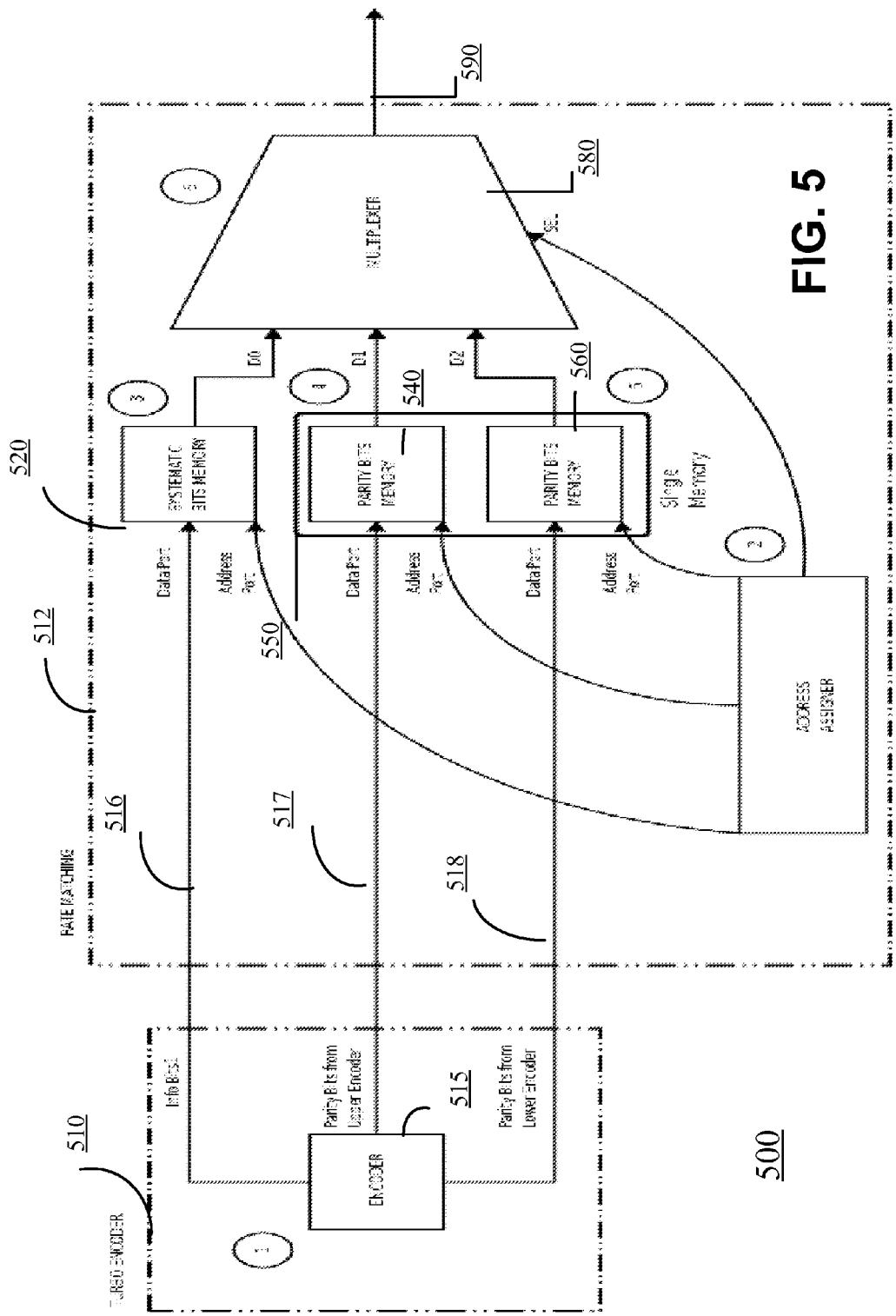
FIG. 5 is a high level block diagram of a circuit for rate matching within a transmitter of a mobile communication system in accordance with an exemplary embodiment.

FIG. 5 is a high level block diagram 500 of a turbo encoder 510 which feeds rate matching circuit 512, designed to operate in accordance with the algorithm proposed in FIG. 2 and which has a flow diagram substantially as in FIG. 4.

Turbo encoder 510, which corresponds to FEC Encoder 130 in FIG. 1, includes turbo encoding block 515 and generates the desired aforementioned information and first and second parity bits to be fed into rate matching circuit 512 along transmission lines 516, 517 and 518. Memory blocks 520 and 540 are also provided. Memory block 540 consists of two logical blocks 550 and 560, each of which is configured to receive a corresponding set of parity bit information along corresponding transmission lines 517 and 518. Memory acts as a buffer from where information is, under the control of address assigner 570, fed into multiplexer 580 and from there transmitted along transmission line 590 from where it will be further processed for over-the-air transmission.

The info bit stream from turbo encoding block 515—also called systematic bit stream—is serially stored in first memory block 520, and which we may also refer to synonymously as systematic bits memory. The parity bits from an upper encoder (within turbo encoding unit 515, also called parity1 bits, are stored serially in second memory block 550, also called the parity1 bits memory. Likewise, parity bits from a lower encoder, also called parity2 bits, are serially stored in the third memory block. The third memory block is also called the parity2 bits memory. Address assigner 570 is coupled directly to memory blocks 520, 540 and facilitates the memory address scheme by which bits will be stored.

When all bits are stored in the appropriate location in memory, address assigner 570 operates to then control multiplexer 580 activity to provide the appropriate sequence in which stored bits will be retrieved in order to be fed to the multiplexer in order to be transmitted in an interleaved manner in accordance with the LTE standard.

In one scenario, during the first K+3 read cycles of memory operation, multiplexer 580 is set to transmit the bits written in first memory block 520, the systematic bits memory.

After the first K+3 read cycles of memory operation, multiplexer 580 is set to transmit the bits from second memory block 550, the parity1 bits memory during the odd read cycles of the memory.

After yet the next K+3 read cycles of memory operation, multiplexer 580 is set to transmit the bits from the third memory block, the parity2 bits memory during the even read cycles of the memory. This way the transmission sequence, as imposed by the LTE standard, is met.

Turbo Encoder 510 stops sending bits to rate matching circuit 512 when the bits that have already been transmitted to the channel, called sent bits, equal, $$sentbits = \frac{(3*K+12)}{codeRate}$$

Figure 7:
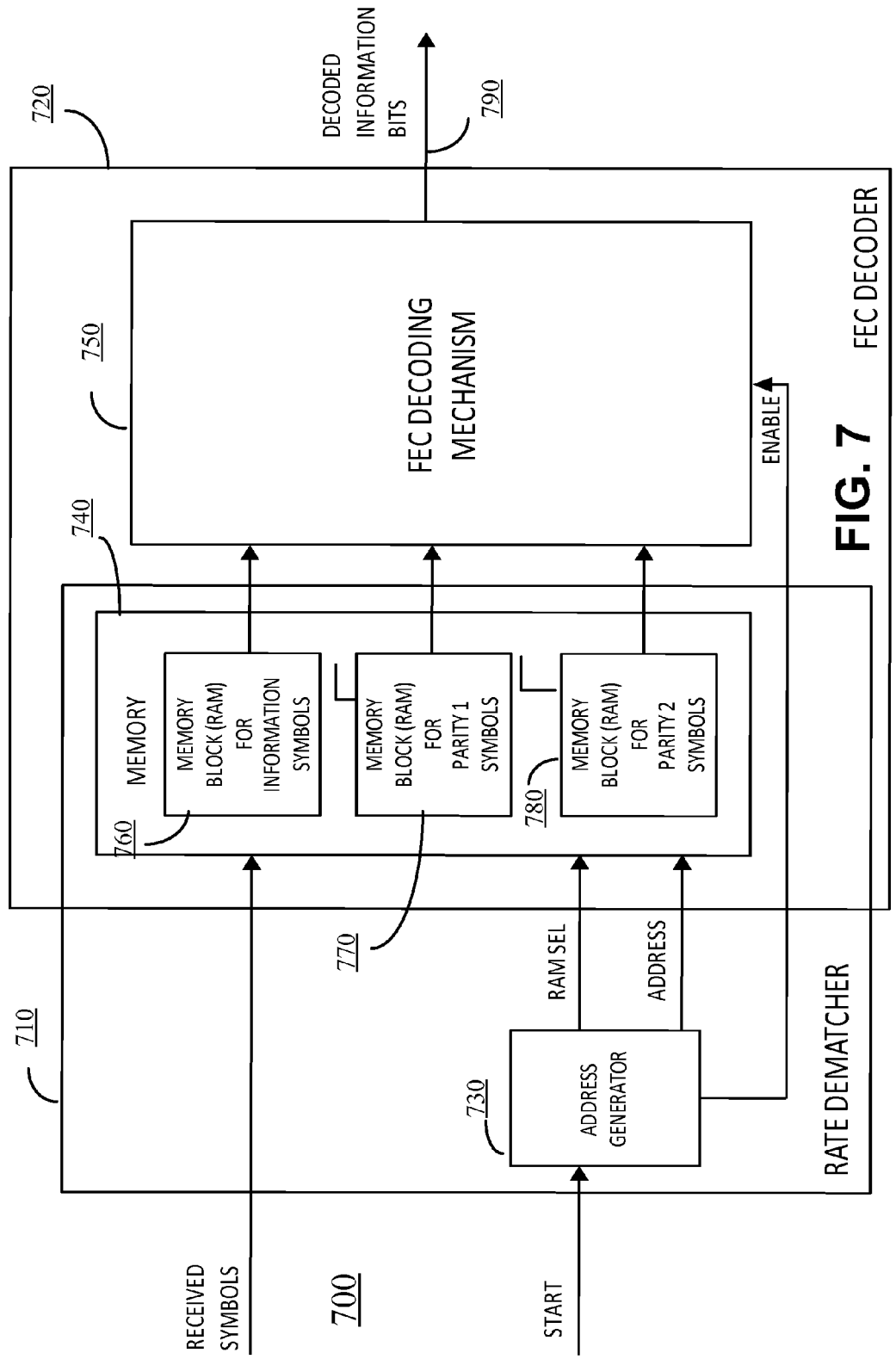
FIG. 7 is a high level block diagram of a circuit for de-rate matching within a receiver of a mobile communication system in accordance with an exemplary embodiment.

FIG. 7 is a high level block diagram 700 of a circuit for de-rate matching within a receiver of a mobile communication system in accordance with an exemplary embodiment. A de-rate matcher 710 is provided which is commonly coupled to FEC decoder 720 and comprises address generator 730. De-rate matcher 710 and FEC decoder 720 share memory 740.

Address assigner 730 is coupled to memory block 740 and consequently to first memory block (info RAM) 760, second memory block (parity 1 RAM) 770 and third memory block (parity 2 RAM) 780. De-rate matcher 710 receives over the air transmitted symbols and interleaves them by storing info symbols into the first memory block. It then stores received parity symbols produced by an upper encoder (not shown) of FEC decoder 720 in the second memory. And it stores the parity symbols produced by a lower encoder (again not shown) in the third memory. In this way, received symbols are deinteleaved.

The address assigner in effect defines the sequence in which symbols are stored in respective memory blocks and ultimately controls the deinteleaving sequence.

Puncturing—a critical step of rate matching and interleaving—is initialized to strong-confident Log-Likelihood Ratio (LLR) values (e.g. +∞ or −∞) and are kept constant during the decoding process. These memory blocks are common parts of the de-rate matching circuit and the FEC decoder (channel decoder). Therefore, the de-rate matching circuit consists of an address generator and employs the memory blocks that the decoding mechanism uses during the procedure of decoding.

Figure 6A:
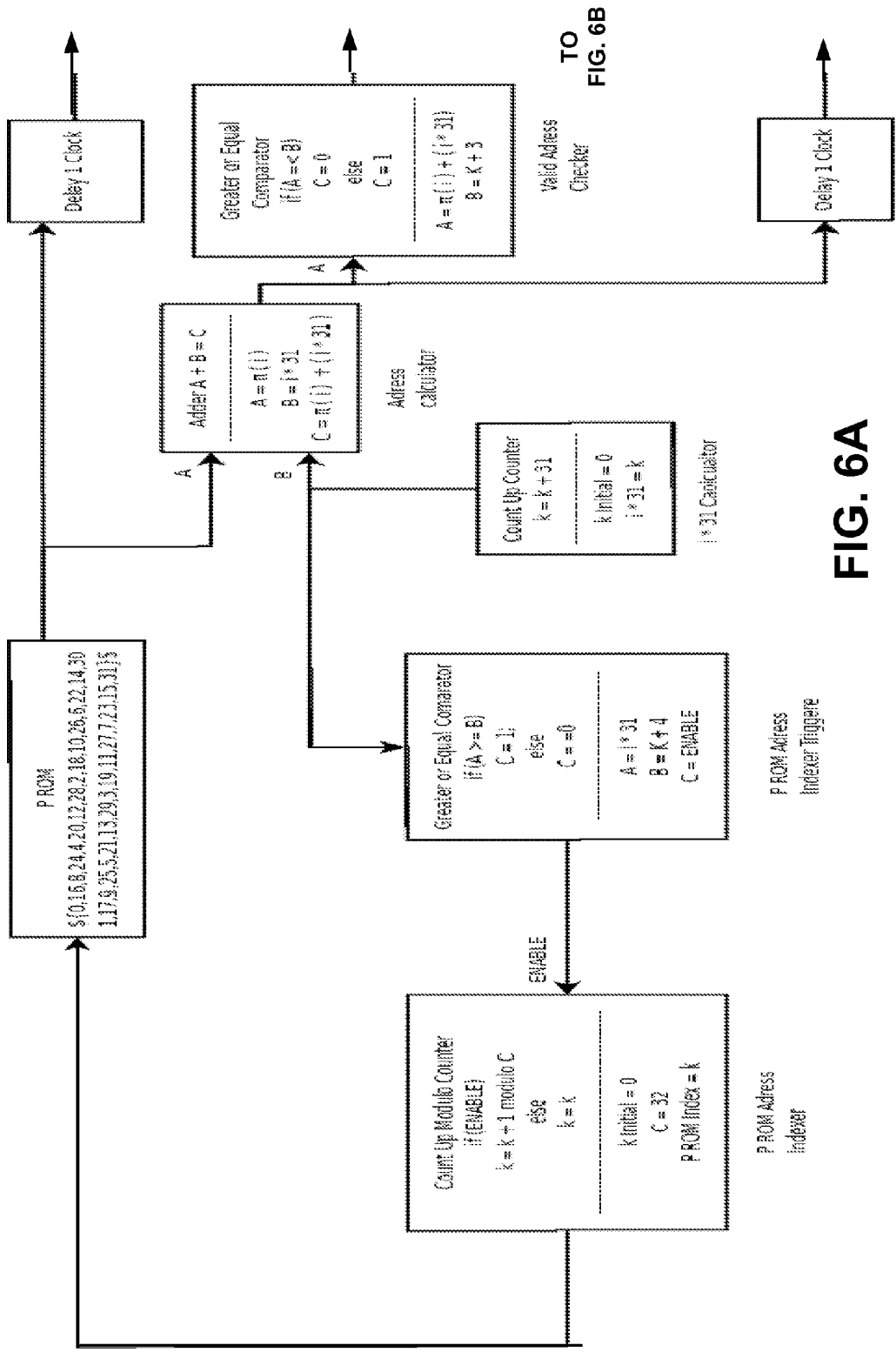
FIGS. 6A and 6B are an operational flow diagram of the address assigning functions provided by the address assigner shown in FIG. 5.
Figure 6B:
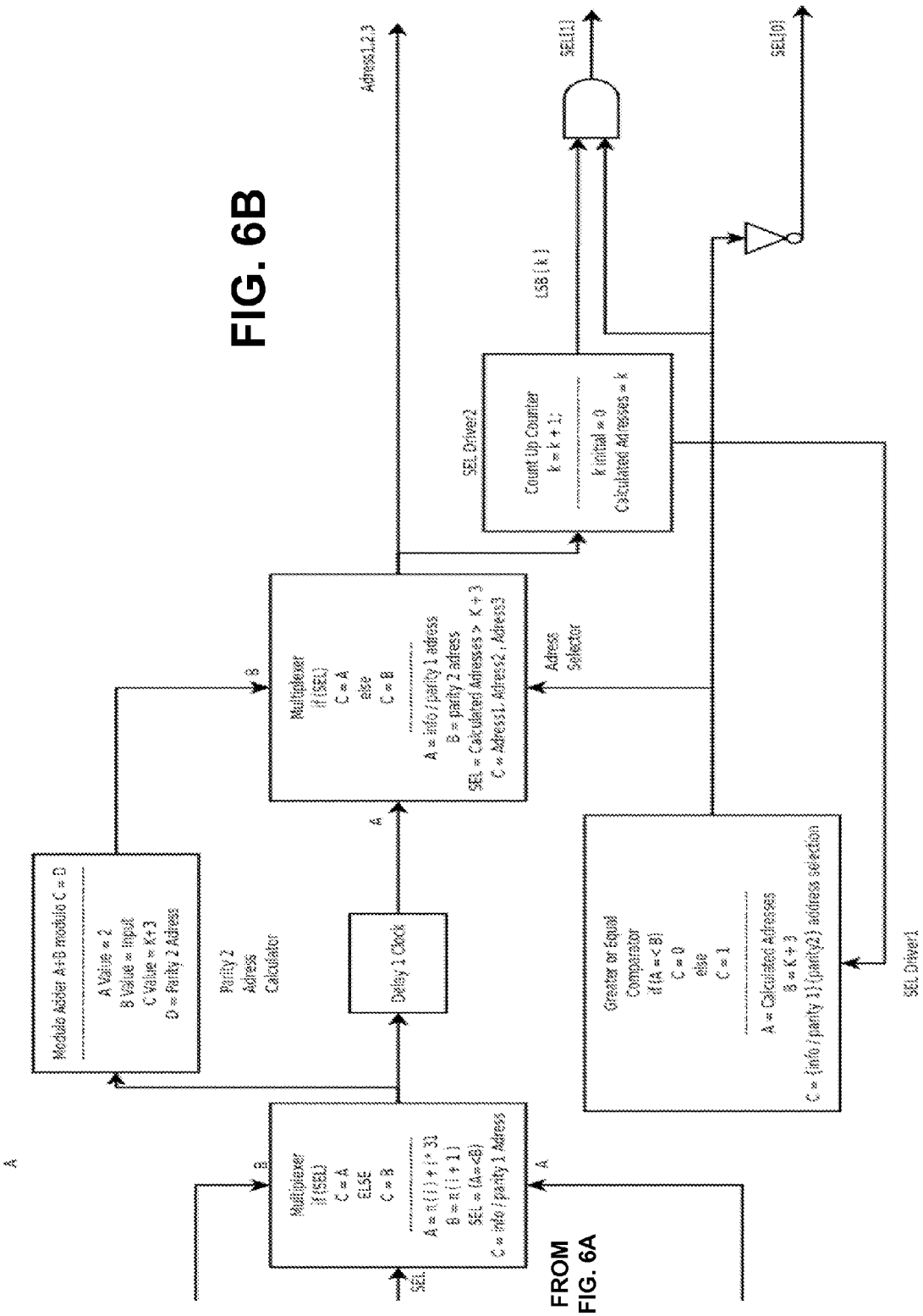

FIGS. 6A and 6B form a single continuous operational flow diagram of the address assigning functions provided by the address assigner shown in FIG. 5.

The address assigner (also called address generator) is the same block used in the rate matching circuit of FIG. 5 and in the de-rate matching circuit of FIG. 7. The address assigner includes various logic blocks to generate the address signal and the multiplexer selection control signal. In the implementation presented the selection control signal is a two bit select signal having bits Sel0 and Sel1.

The address assigner includes the logic blocks to generate the functions described by the algorithm of FIG. 3. The address assigner calculates the memory address based on the implementation of the functions π1, π2 that are used in the algorithm of FIG. 3. These functions calculate the address of the next bit to be read according to the interleaving pattern that is employed by the LTE standard.

$$\pi1(k) = P\left(\left\lfloor \frac{k}{R_{TC}} \right\rfloor\right) + \left\lfloor \frac{k}{R_{TC}} \right\rfloor * C_{TC}$$

$$\pi2(k) = \mathrm{mod}\left(P\left(\left\lfloor \frac{k}{R_{TC}} \right\rfloor\right) + \left\lfloor \frac{k}{R_{TC}} \right\rfloor * C_{TC} + 2, K+4\right)$$

The schematic representation of each logic block of FIG. 6 includes information regarding pseudo-code executed by each logic block. It also shows information about the physical meaning of the inputs and outputs, I/Os, of the blocks.

Each block is tagged by an internal (inside the box) and an external title (below the box). The internal title describes each block's physical form (e.g. ROM, binary counter etc) and the external tag describes their operation.

The P ROM is a ROM that holds the array shown below:
{0,16,8,24,4,20,12,28,2,18,10,26,6,22,14,30}
{1,17,9,25,5,21,13,29,13,11,27,7,23,15,31}
The contents of the P ROM are actually the vector(s) that is defined by LTE. The P ROM outputs its contents serially.

The P ROM address is provided, by the P ROM Address Indexer which is a binary counter providing 32 values, counting from 0 to 31. For the value P ROM address Indexer to change, the i*31 Calculator must produce a value that is greater than K+4.

This way the address index of the P ROM is always:

$$PROMindex = \left\lfloor \frac{i*32}{K+4} \right\rfloor$$

When the event:

$i*32 \geq K+4$ is performed by the P ROM Address Indexer Triggerer. The P ROM Address Indexer Trigger may be implemented as a greater or equal comparator. The P ROM Address Indexer Triggerer enables the P ROM address Indexer to increase the index value of the PROM.

The value i*32 is calculated by the i*32Calculator which is a counter with step value 32. When the value outputted by the i*32Calculator exceeds the limit K+4 the i*32Calculator is reset to zero-value position and restarted. The Addresses Calculator outputs the sum of the value generated by the i*32 Calculator plus the i*31 value. The Addresses Calculator can be implemented as an adder.

The Parity2 Addresses Calculator receives as an input the output of the Addresses Calculator and performs the following operation:

parity2address=modulo(infoaddress+2,K+4)

The Address Selector chooses among the output of the Address Calculator and Parity2 Address Calculator and outputs the address for the memory. The Address Selector can be implemented as a multiplexer.

The SEL 2 Driver acts as a counter and it provides control signal (SEL), to the multiplexer.

In this way the address generator manages firstly to support all the interleaving schemes for all the different info frame lengths supported by the LTE standard, without use of additional memory or logic complexity overhead.

Those of skill would appreciate that the logic circuitry of the address assigner may also be implemented using a processor, DSP, hardwire logic, or software embedded in a processor.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. In a communication device including first, second and third memory blocks and an address assigner, a method of rate matching comprising:

storing a set of encoded non-interleaved information bits to the first memory block and a first and a second sets of non-interleaved parity bits to the second memory block and the third memory block, respectively; and using an address assigner, retrieving the set of encoded non-interleaved information bits and the first and the second sets of non-interleaved parity bits from the respective memory blocks on the basis of and in sequence as defined by a rate matching process of an associated communications standard wherein the retrieving involves having a multiplexer enabled and disabled by the address assignor on the basis of and in sequence as defined by the rate matching process of the associated communications standard.

2. The method of claim 1, wherein the associated communications standard is a 3rd Generation Partnership Project Long Term Evolution (LTE) telecommunication standard.

3. In a communication device including first, second and third memory blocks and an address assigner, a method of de-rate matching, comprising:

storing a set of encoded non-interleaved information bits to the first memory block and a first and a second sets of non-interleaved parity bits to the second memory block and the third memory block, respectively; and using an address generator, retrieving the set of encoded non-interleaved information bits and the first and the second sets of non-interleaved parity bits from the respective memory blocks on the basis of and in sequence as defined by a de-rate matching process of an associated communications standard wherein the retrieving involves having a multiplexer enabled and disabled by the address generator on the basis of and in sequence as defined by the rate matching process of the associated communications standard.

4. The method of claim 3, wherein the associated communications standard is 3rd Generation Partnership Project Long Term Evolution (LTE) telecommunication standard.

* * * * *